(12) United States Patent
Biard et al.

(10) Patent No.: US 12,727,401 B2
(45) Date of Patent: Sep. 1, 2026

(54) METHOD FOR FABRICATING A POLYCRYSTALLINE SILICON CARBIDE CARRIER SUBSTRATE

(71) Applicant: Soitec, Bernin (FR)

(72) Inventors: Hugo Biard, Bernin (FR); Mélanie Lagrange, Bernin (FR)

(73) Assignee: Soitec, Bernin (FR)

( * ) Notice: Subject to any disclaimer, the term of this patent is extended or adjusted under 35 U.S.C. 154(b) by 345 days.

(21) Appl. No.: 18/692,239

(22) PCT Filed: Sep. 6, 2022

(86) PCT No.: PCT/FR2022/051682
§ 371 (c)(1),
(2) Date: Mar. 14, 2024

(87) PCT Pub. No.: WO2023/047035
PCT Pub. Date: Mar. 30, 2023

(65) Prior Publication Data

US 2024/0379351 A1 Nov. 14, 2024

(30) Foreign Application Priority Data

Sep. 22, 2021 (FR) ....................................... 2109961

(51) Int. Cl.
*H01L 21/02* (2006.01)
*H10P 14/20* (2026.01)

(52) U.S. Cl.
CPC ...... *H10P 14/2904* (2026.01); *H10P 14/3408* (2026.01)

(58) Field of Classification Search
CPC ......................... H10P 14/2904; H10P 14/3408
(Continued)

(56) References Cited

U.S. PATENT DOCUMENTS 5,714,395 A 2/1998 Bruel
2003/0129780 A1 7/2003 Auberton-Herve
(Continued)

FOREIGN PATENT DOCUMENTS

JP 08-188408 A 7/1996
KR 10-2016-0137746 A 12/2016
(Continued)

OTHER PUBLICATIONS

International Search Report for Application No. PCT/FR2022/051682 dated Dec. 23, 2022, 2 pages.
(Continued)

*Primary Examiner* — Dzung Tran
(74) *Attorney, Agent, or Firm* — TraskBritt

(57) ABSTRACT

A method of fabricating a polycrystalline silicon carbide carrier substrate involves growing an initial polycrystalline silicon carbide substrate on a seed of graphite or of silicon-carbide. A stiffening carbon film is then formed on a front face of the initial substrate. The initial substrate has, in the plane of its front face, a first average silicon carbide grain size. The seed is then removed, so as to free the back face of the initial substrate, which has, in the plane of its back face, a second average silicon carbide grain size, which is smaller than the first average size. The back face of the initial substrate is then thinned to a thickness for which the initial substrate has, in the plane of its thinned back face, a third average grain size equal to the first average grain size to within ±30%.

20 Claims, 6 Drawing Sheets

(58) Field of Classification Search
USPC .......................................................... 438/478
See application file for complete search history.

(56) References Cited

U.S. PATENT DOCUMENTS

| | | | |
|---|---|---|---|
| 2019/0153616 | A1 | 5/2019 | Yagi et al. |
| 2019/0382918 | A1 | 12/2019 | Nagasawa et al. |

FOREIGN PATENT DOCUMENTS

| | | | |
|---|---|---|---|
| KR | 10-2018-0020442 | A | 2/2018 |
| KR | 10-2019-0101496 | A | 8/2019 |
| KR | 10-2019-0121366 | A | 10/2019 |

OTHER PUBLICATIONS

International Written Opinion for Application No. PCT/FR2022/051682 dated Dec. 23, 2022, 4 pages.

Korean Office Action for Application No. 10-2024-7012435 dated Feb. 19, 2026, 16 pages with machine translation.

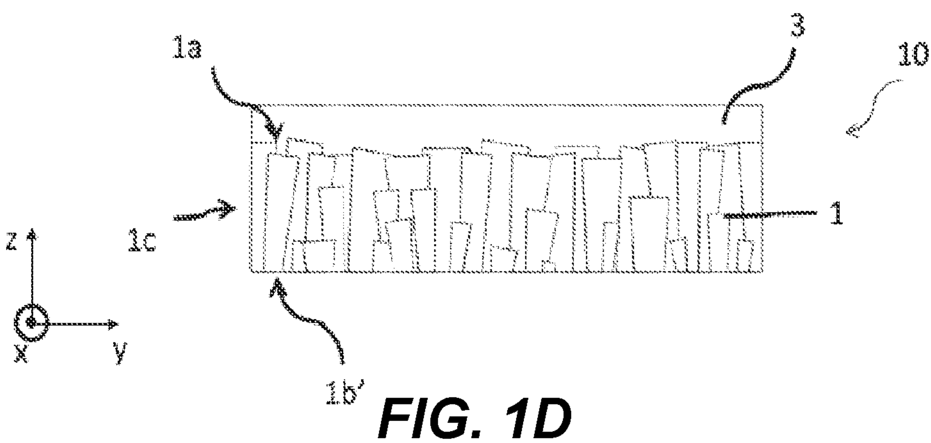
FIG. 1D
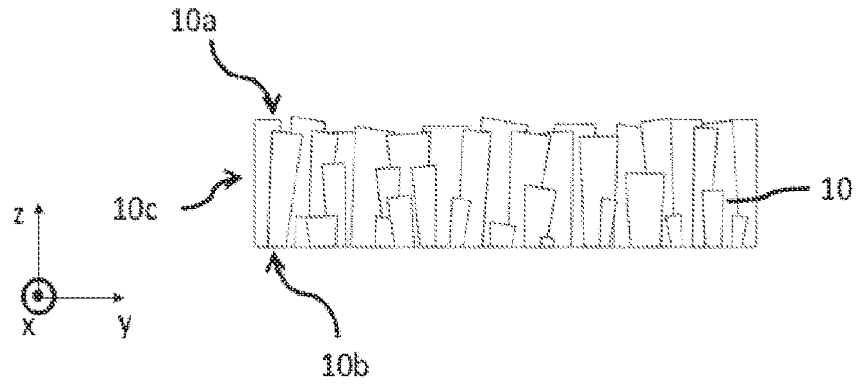
FIG. 1E
10b
20
100
10c
10
z
x
y
10a
FIG. 1F

METHOD FOR FABRICATING A POLYCRYSTALLINE SILICON CARBIDE CARRIER SUBSTRATE

CROSS-REFERENCE TO RELATED APPLICATIONS

This application is a national phase entry under 35 U.S.C. § 371 of International Patent Application PCT/FR2022/051682, filed Sep. 6, 2022, designating the United States of America and published as International Patent Publication WO 2023/047035 A1 on Mar. 30, 2023, which claims the benefit under Article 8 of the Patent Cooperation Treaty of French Patent Application Serial No. FR2109961, filed Sep. 22, 2021.

TECHNICAL FIELD

The present disclosure relates to the field of semiconductor materials for microelectronic components. The disclosure relates, in particular, to a process for manufacturing a polycrystalline silicon carbide support substrate, which is particularly suitable for the production of a composite structure comprising a thin layer of single-crystal silicon carbide arranged on the support substrate.

BACKGROUND

SiC is increasingly widely used for manufacturing innovative power devices to meet the needs of rising fields in electronics, notably such as electric vehicles. Specifically, power devices and integrated power-supply systems based on single-crystal silicon carbide are able to handle a much higher power density than their conventional silicon equivalents, and to do so with active regions of smaller size.

Nevertheless, high-quality single-crystal SiC substrates (c-SiC) intended for the microelectronics industry remain expensive and difficult to supply at a large size. It is thus advantageous to resort to layer transfer solutions, to prepare composite structures typically comprising a thin layer of single-crystal SiC (obtained from the high-quality c-SiC substrate) on a lower cost support substrate, for example, made of polycrystalline SiC (p-SiC). One well-known thin-layer transfer solution is the SMART CUT® process, based on implanting light ions and joining by direct bonding at a bonding interface.

U.S. Patent Application Publication No. 2019153616 provides a process for manufacturing a p-SiC support substrate onto which a c-SiC thin layer can be transferred. The support substrate comprises grains of average size on the order of 10 μm and has a degree of variation of the grain size between its front and rear faces, relative to its thickness, of less than or equal to 0.43%; the latter feature makes it possible to limit the residual stress in the support substrate and thus its curvature.

The manufacturing process involves a first carbon base substrate on which a thick layer (typically 2 mm) of p-SiC is produced by chemical vapor deposition. A second p-SiC base substrate, approximately 350 μm thick, is extracted from the thick layer of p-SiC, by removing the first carbon base substrate and mechanically thinning both faces of the thick layer. The second base substrate has a degree of grain size variation between its front and rear faces, relative to its thickness, of less than or equal to 0.43%. A new p-SiC layer (typically on the order of 400 μm) is then formed by chemical vapor deposition on the second base substrate: separated from the second base substrate, for example, by laser irradiation, this new p-SiC layer forms the p-SiC support substrate intended for use in a composite structure. The second base substrate can then be reused.

In practice, the step of forming the second base substrate can prove to be complex since the removal of the first carbon base substrate generally induces a very large curvature in the thick p-SiC layer, which can cause the thick layer to break, or at the very least complicate or prevent the thinning step required to achieve the thickness of the second base substrate. In addition, this thinning is very substantial (on the order of 1.5 mm) and costly in terms of p-SiC material and deposition and thinning steps.

BRIEF SUMMARY

The present disclosure proposes a manufacturing process that addresses the abovementioned problem. It relates to a process for manufacturing a polycrystalline SiC support substrate, which is economical and simplified. The support substrate is also particularly suitable for the manufacture of a composite structure including a thin c-SiC layer arranged on the p-SiC support substrate.

The disclosure relates to a process for manufacturing a polycrystalline silicon carbide support substrate, comprising the following steps:

a) growing an initial polycrystalline silicon carbide substrate on a seed of graphite or silicon carbide; on conclusion of step a), the initial substrate having a free front face and a rear face in contact with the seed, b) forming a stiffening carbon film on the front face of the initial substrate, the initial substrate having, in the plane of its front face and just before the formation of the stiffening film, a first average silicon carbide grain size, c) removing the seed, so as to free the rear face of the initial substrate, the latter having, in the plane of its rear face and just after removal of the seed, a second average silicon carbide grain size, smaller than the first average size, d) thinning the rear face of the initial substrate to a thickness for which the initial substrate has, in the plane of its thinned rear face, a third average grain size equal to the first average grain size to within ±30%, the thinned initial substrate forming the support substrate.

According to other advantageous and non-limiting features of the disclosure, taken alone or in any technically feasible combination:

- the stiffening film has a thickness of between 100 nm and several millimeters, for example, 10 mm;
- the stiffening film has a thickness of between 100 nm and 10 μm;
- the stiffening carbon film has a diamond-like or glassy carbon-like crystallographic structure;
- step b) is performed by spreading a polymer resin having preformed carbon-carbon bonds in three dimensions as a viscous layer on the front face of the initial substrate and annealing at a temperature of between 500° C. and 2000° C. to form the stiffening carbon film;
- the polymer resin is based on coal tar, phenol formaldehyde, polyfurfuryl alcohol, polyvinyl alcohol, polyacrylonitrile, polyvinylidene chloride, and/or polystyrene;
- step b) is performed by plasma deposition, ion bombardment deposition or evaporation deposition;
- the manufacturing process comprises a step a'), between step a) and step b), of grinding the front face and/or a periphery of the initial substrate, to reduce a surface roughness of the face and/or a variation in the thickness of the substrate, and/or to regularize its periphery;

step a') comprises mechanical or chemical-mechanical thinning;

the manufacturing process comprises:

a step e), after step d), of removing the stiffening film, and/or a step, after step d) or after step e), of heat treatment at a temperature greater than or equal to 1500° C.

The disclosure also relates to a process for manufacturing a composite structure, involving the above process and also comprising a step f) of transferring a thin layer of single-crystal silicon carbide onto a first or second face of the support substrate, directly or via an intermediate layer, to form the composite structure.

According to other advantageous and non-limiting features of the disclosure, taken alone or in any technically feasible combination:

the intermediate layer is formed by the stiffening carbon film retained on the first face of the support substrate;

the transfer of the thin layer is performed on one of the faces of the support substrate and an additional carbon film is arranged on the other free face of the support substrate prior to the transfer; and the additional film is removed, preferably after the composite structure has undergone any heat treatments at temperatures above 1400° C. required for its manufacture or for that of components on and/or in the structure.

BRIEF DESCRIPTION OF THE DRAWINGS

Other features and advantages of the disclosure will become apparent from the following detailed description of the disclosure, which is given with reference to the accompanying figures, in which:

FIGS. 1A through 1F show steps of a manufacturing process in accordance with the disclosure;

The same references in the figures may be used for elements of the same type. The figures are schematic representations which, for the sake of legibility, are not to scale. In particular, the thicknesses of the layers along the z-axis are not to scale with respect to the lateral dimensions along the x- and y-axes; and the relative thicknesses of the layers with respect to each other have not necessarily been respected in the figures.

DETAILED DESCRIPTION

The present disclosure relates to a process for manufacturing a polycrystalline silicon carbide (p-SiC) support substrate 10.

Figure 1A:
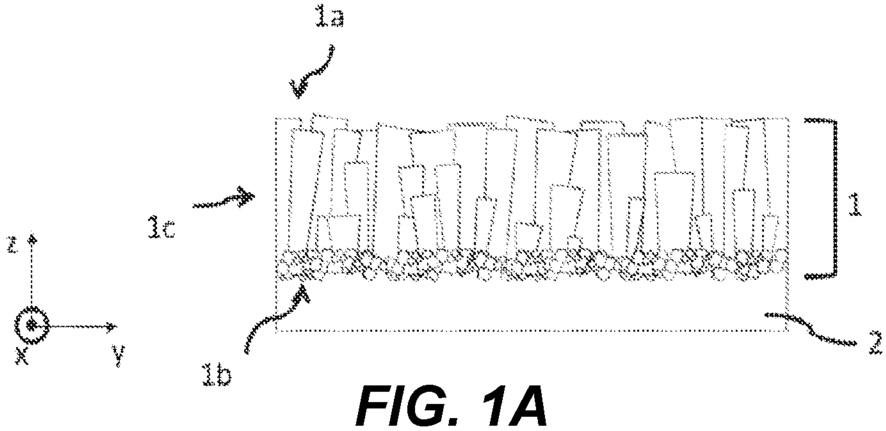

The process first comprises a step a) of growing an initial polycrystalline silicon carbide substrate 1 on a seed 2 of graphite or low quality single-crystal or polycrystalline silicon carbide (FIG. 1A). The seed 2 is preferably in the form of a wafer whose diameter is substantially that which is targeted for the support substrate 10, for example, 100 mm, 150 mm, 200 mm or even 300 mm.

The growth of the initial p-SiC substrate 1 is performed by a known chemical vapor deposition (CVD) technique, at a temperature typically between 1100° C. and 1500° C. The precursors may be chosen from methylsilane, dimethyldichlorosilane or dichlorosilane and i-butane, preferably with a C/Si ratio close to or greater than 1. Optionally, doping species (for instance, nitrogen or phosphorus) may be introduced during the CVD deposition, so as to adjust the resistivity of the initial substrate 1 (from which the support substrate 10 will be derived) to the specifications of the final product, in particular of the targeted composite structure. The doping levels usually targeted are greater than 1E18/$cm^3$ or even greater than 1E20/$cm^3$.

On conclusion of step a), the initial substrate 1 has a free front face 1*a* and a rear face 1*b* in contact with the seed 2. The thickness of the initial substrate 1 is less than 1 mm, preferably less than 550 μm. It should be noted that the thickness range usually desired for a support substrate 10 intended for the production of a composite structure is 100 μm-500 μm.

The initial substrate 1 may include 4H, 6H and/or 3C type silicon carbide grains, depending on the CVD deposition conditions.

The average size of the grains on the rear face 1*b* of the initial substrate 1 is relatively small, typically less than or equal to 1 μm, or even less than or equal to 100 nm; the grains correspond to the p-SiC material produced at the start of the CVD deposition (nucleation phase) on the graphite seed 2.

It should be recalled that the size of a grain, delimited by the grain boundaries, corresponds to the largest dimension of the grain, in the plane of the considered face of the substrate. The average grain size is defined as the average of the sizes of the individual grains in the plane. Grain sizes or grain boundary distances can be measured on the basis of images obtained by conventional scanning electron microscopy (SEM) or involving electron back-scattered diffraction (EBSD). It may also be envisaged to use X-ray crystallography. When the face under consideration mainly comprises grains of micrometric size (typically from a few microns to a few tens of microns), the very small grains, typically less than 50 nm, are preferably excluded from the measurement, so as to limit the measurement uncertainties.

As the CVD deposition proceeds, the p-SiC grains increase in size until they reach a relatively stable average size, for a deposit thickness that may vary between a few micrometers and a few tens of micrometers, depending on the deposition conditions.

Thus, depending on the thickness of p-SiC deposited to grow the initial substrate 1, the average grain size on the front face of the initial substrate 1 may typically vary between 1 and 10 μm.

Hereinbelow, the average size of the p-SiC grains on the front face 1*a* of the initial substrate 1 will be referred to as the first average size, and the average size of the p-SiC grains on the rear face 1*b* of the initial substrate 1 will be referred to as the second average size.

The first average p-SiC grain size (front face side 1*a*) is greater than the second average grain size (rear face side 1*b*), the latter corresponding to the nucleation phase.

Figure 1B:
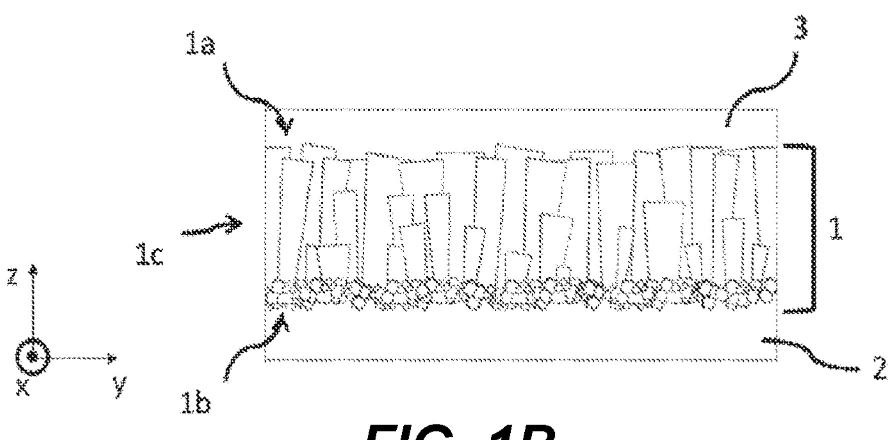

The manufacturing process then comprises a step b) of forming a stiffening carbon film 3 on the front face 1*a* of the initial substrate 1 (FIG. 1B). The stiffening film 3 has a thickness ranging from 100 nm to several millimeters, for example, 10 mm. Preferably, its thickness is between 100 nm and 10 μm.

Advantageously, the stiffening carbon film 3 has a diamond-type crystallographic structure, i.e., including $sp^3$ carbon-carbon atomic bonds, or a glassy carbon-type structure, including $sp^2$ carbon-carbon atomic bonds.

The stiffening carbon film 3 may be formed via various conventional deposition techniques, notably such as plasma deposition, ion bombardment deposition or evaporation deposition.

Alternatively, step b) may be performed by spreading a polymer resin including preformed carbon-carbon bonds in three dimensions as a viscous layer on the front face 1*a* of the initial substrate 1. This spreading may be performed by centrifugation. Next, annealing is applied at a temperature of between 500° C. and 2000° C., typically between 600° C. and 1100° C., under nitrogen, to form the stiffening carbon film 3, by chemical decomposition of the resin (pyrolysis). The temperature ramps chosen are typically on the order of 10° C./minute and the annealing time is on the order of one hour. The temperature rise is controlled so that the effective temperature remains below the resin/carbon glass transition temperature.

The polymer resin may be formed from coal tar, phenol formaldehyde, polyfurfuryl alcohol, polyvinyl alcohol, polyacrylonitrile, polyvinylidene chloride, and/or polystyrene, etc.

By way of example, known photosensitive resins may be used, such as the commercial products AZ-4330, AZ-P4620 (registered trademarks) (based on 1-methoxy-2-propanol acetate, diazonaphthoquinonesulfonic esters, 2-methoxy-1-propanol acetate, cresol novolak resin), OCG-825 (based on ethyl 3-ethoxypropionate), SU-8 2000 (based on cyclopentanone, triarylsulfonium/hexafluoroantimonate salts, propylene carbonate, epoxy resin), usually used for photolithography steps in the field of microelectronics.

Epoxy resins, for instance, the Epoxy Novolac EPON product (registered trademark), proposed for coating and protecting various surfaces in various fields (aeronautics, marine, automotive, construction, etc.), may also be used in step b) of the process according to the disclosure.

When using resins, it is important to take into account the contraction that the viscous resin layer will undergo during annealing, in order to define its initial thickness sufficient to obtain the targeted thickness of stiffening carbon film 3. The thickness contraction can typically be between 70% and 95%. The carbon ratio, i.e., the ratio between the mass of the polymer resin layer after pyrolysis (corresponding to the stiffening carbon film 3) and the initial mass of the spread polymer resin layer, must be at least 5%, preferably greater than 50%.

Optionally, the manufacturing process may comprise a step a'), between step a) and step b), of grinding the front face 1*a* and/or a periphery 1*c* of the initial substrate 1, to reduce a surface roughness of the front face 1*a* and/or to reduce a thickness variation of the initial substrate 1, and/or to regularize the periphery 1*c*.

Step a') may comprise mechanical or chemical-mechanical thinning (polishing, i.e., "CMP"), with removal on the order of a few microns to a few tens of microns of material.

Figure 1C:
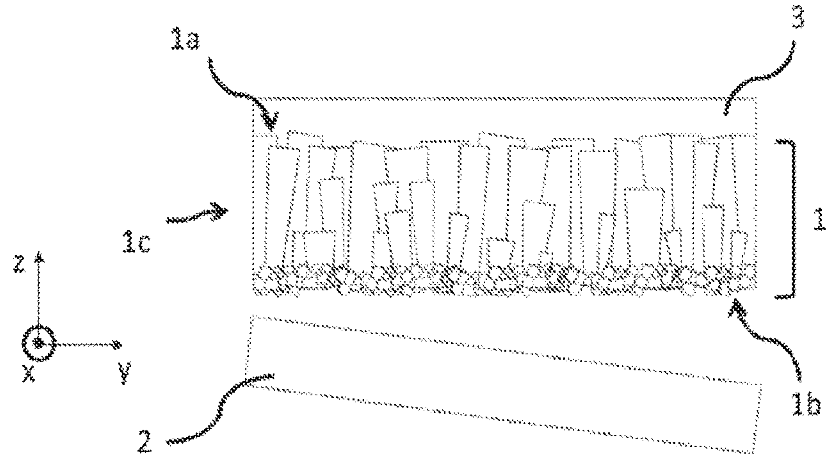

The manufacturing process according to the disclosure then comprises a step c) of removing the seed 2, so as to free the rear face 1*b* of the initial substrate 1 (FIG. 1C).

When the seed 2 is made of graphite, the removal can be performed by burning the graphite, by applying a heat treatment, in an oxygen-rich atmosphere (for example, air), at a temperature above 400° C., preferably above 550° C.

It is also possible to mechanically detach the seed 2, whether it is made of graphite or silicon carbide, for example, by localized application of a mechanical stress, at or near the interface between the seed 2 and the initial substrate 1.

If any residues remain on the rear face 1*b* of the initial substrate 1 after removal of the seed 2, they can be burnt off (when they are made of graphite) or removed mechanically or chemically by polishing or etching (when they are made of graphite or SiC).

This removal typically gives rise to a strong curvature of the initial substrate 1, which may be up to 500 μm for a diameter of 150 mm. This curvature is mainly due to the stresses associated with the difference in grain sizes between the rear face 1*b* (nucleation grains, small average size) and the front face 1*a*.

In the context of the present disclosure, the stiffening carbon film 3 makes it possible to greatly limit the increase in curvature during the removal of the seed 2, by mechanically holding the initial substrate 1 by its front face 1*a*. The curvature of the initial substrate 1, equipped with the stiffening carbon film 3, does not exceed 200 μm for a substrate diameter of 150 mm; indeed, the curvature is even maintained below 100 μm. In these curvature ranges, the initial substrate 1 can be processed without any problems in standard lines and equipment, without any risk of breakage or of equipment failure; these problems are mainly encountered for curvatures of greater than 300 μm (diameter 150 mm).

Finally, the manufacturing process includes a step d) of thinning the rear face 1*b* of the initial substrate 1. The thinned initial substrate 1 forms the support substrate 10 (FIG. 1D).

The thinning in step d) is performed by mechanical grinding, mechanical polishing and/or chemical-mechanical polishing (CMP) of the rear face 1*b*. The material removal is typically between a few tens of microns and 200 μm, depending on the thickness of the initial substrate 1 at the start of step d), and, of course, depending on the thickness targeted for the support substrate 10.

The thinning is performed up to a thickness for which the initial substrate 1 has, in the plane of its thinned rear face 1*b*', a third average grain size equal to the first average grain size to within ±30%. In other words, if the first average size is, for example, 5 μm, the third average size is expected to be between 4 μm and 6 μm.

It may arise that the grain sizes in the plane of the front face 1*a* or in the plane of the rear face 1*b* are distributed in a double population, with each peak following a substantially Gaussian distribution. According to a first option, the average grain size is calculated by taking the overall average including both populations, and the first and third average sizes should not differ by more than 30%. According to a second option, the first two average sizes (corresponding to the double population on the front face side 1*a*) and the third two average sizes (corresponding to the double population on the rear face side 1*b*) are taken into consideration, which must not differ from each other by more than 30%, respectively.

After the thinning in step d), the thinned rear face 1*b*' of the initial substrate 1 has an average p-SiC grain size differing by less than 30% from the average grain size of the front face 1*a*. The residual stress in the thinned initial substrate 1 (which forms the support substrate 10) is then compatible with a small curvature, and at least manageable on manufacturing lines.

The manufacturing process may then comprise a step e) of removing the stiffening carbon film 3, for example, by dry or wet chemical etching (FIG. 1E). After this removal, the support substrate 10 has a curvature of less than 200 μm, or even less than 100 μm (for a diameter of 150 mm), due to the reduced residual stress in its volume.

At this stage, the support substrate 10 has a first face 10*a*, a second face 10*b* and an edge 10*c*, corresponding, respectively to the front face 1*a*, the thinned rear face 1*b*' and the periphery 1*c* of the initial substrate 1 after step d).

By way of example, to form a support substrate 350 μm thick and 150 mm in diameter, an initial substrate 1 of 500 μm may be produced on the seed 2, the initial substrate 1 having a first average p-SiC grain size on its front face 1*a* of about 4 μm. A step for correcting the thickness uniformity of the initial substrate 1 may be performed, for example, via a removal of 50 μm. A 4 μm stiffening carbon film 3 is formed on this front face 1*a*. After removal of the graphite seed 2, the second average grain size on the rear face 1*b* of the initial substrate 1 is less than 100 nm; but the curvature of the initial substrate 1, due to the presence of the stiffening carbon film 3, is maintained below 150 μm. A removal of 100 μm on its rear face 1*b* is performed, and the third average grain size of p-SiC on the thinned rear face 1*b*', on the order of 3 μm, satisfies the condition of equality to within 30% of the first average grain size. Thus, after removal of the stiffening carbon film 3, the curvature of the support substrate 10 is less than 200 μm and is compatible with subsequent steps for manufacturing a composite structure 100.

Optionally, after step e), a surface treatment may be applied to the first face 10*a* of the support substrate 10, in particular, if this face 10*a* is intended to receive the thin working layer 20 of the composite structure 100, in a subsequent step f) of the process. This surface treatment may comprise mechanical grinding, chemical-mechanical polishing (CMP) or other chemical cleaning operations, depending on the surface roughness of the first face 10*a*.

If the second face 10*b* of the support substrate 10 is intended to receive the thin working layer 20, and step d) has not achieved a sufficiently low level of roughness (typically <1 nm RMS, measured by atomic force microscopy on 20 μm×20 μm scans), an additional surface treatment may also be applied thereto.

The face of the support substrate 10 intended to form the rear face of the composite structure 100 may have a higher surface roughness, for example, on the order of 10 nm RMS.

The manufacturing process may also comprise a heat treatment, after step d) or after step e), at a temperature greater than or equal to 1500° C., typically between 1500° C. and 1900° C., so as to stabilize the polycrystalline structure of the support substrate 10. Indeed, these temperature ranges are liable to be applied later in the process, notably for the manufacture of a composite structure.

By virtue of the manufacturing process according to the present disclosure, a support substrate 10, having mechanical characteristics that are compatible with the specifications of a composite structure for microelectronic applications, may be obtained in a simple manner, without the need to deposit a very thick initial p-SiC substrate, which is more than 80% removed, in order to select a very small useful portion of p-SiC, as is performed in the processes of the prior art. In the manufacturing process according to the present disclosure, the thickness of the initial substrate 1 formed is less than or equal to 1 mm and the material removal at its front face 1*a* and/or its rear face 1*b* is less than 70%, or even less than 50% of the initial thickness, which affords a saving in material and technological steps.

In the context of the development of a composite structure 100, the manufacturing process according to the disclosure may be continued by a step f) of transferring a working layer 20 made of single-crystal silicon carbide onto the support substrate 10, based on molecular adhesive bonding (FIG. 1F).

There are various options, known in the prior art, for performing a layer transfer, which will not be described here in detail.

According to a preferred mode, step f) of the process involves an implantation of light species according to the principle of the SMART CUT® process.

Figure 2A:
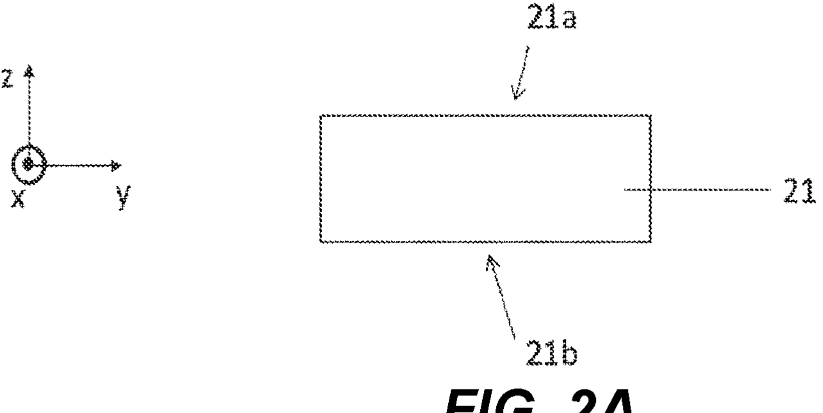
FIGS. 2A through 2D show other steps of a manufacturing process in accordance with the disclosure.

In a first phase f1), a single-crystal silicon carbide donor substrate 21, from which the working layer 20 will be derived, is provided (FIG. 2A). The initial substrate 1 is preferably in the form of a wafer with a diameter of 100 mm, 150 mm, 200 mm, or even 300 mm (identical or very similar to that of the support substrate 10), and with a thickness typically between 300 μm and 800 μm. It has a front face 21*a* and a rear face 21*b*. The surface roughness chosen for the front face 1*a* is advantageously less than 1 nm RMS, or even less than 0.5 nm RMS, measured by atomic force microscopy (AFM) on a 20 μm×20 μm scan. The donor substrate 21 may be of polytype 4H or 6H, and may have n-or p-type doping, depending on the requirements of the components to be developed on and/or in the working layer 20 of the composite structure 100.

Figure 2B:
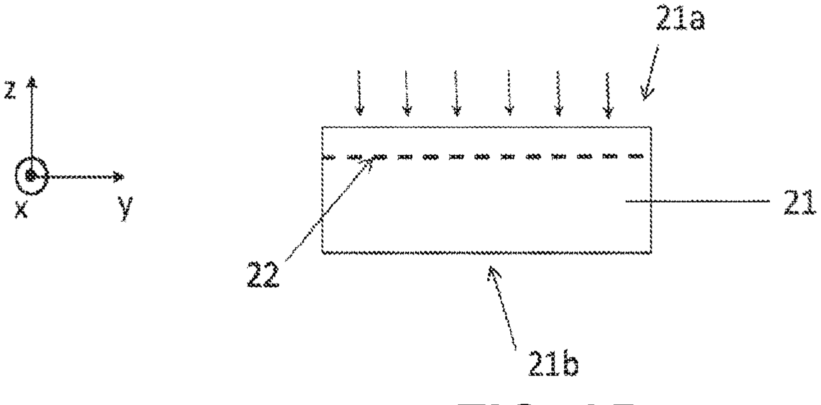

A second phase f2) corresponds to the introduction of light species into the donor substrate 21 to form a buried fragile plane 22 delimiting, with a front face 21*a* of the donor substrate 21, the working layer 20 to be transferred (FIG. 2B).

The light species are preferably hydrogen, helium or a co-implantation of these two species, and are implanted into the donor substrate 21 to a given depth, consistent with the targeted thickness of the working layer 20. These light species will form, around the given depth, microcavities distributed as a thin layer parallel to the free surface 21*a* of the donor substrate 21, i.e., parallel to the plane (x, y) in the figures. This thin layer is referred to as the buried fragile plane 22, for the sake of simplicity.

The energy of implantation of the light species is chosen so as to reach the given depth. For example, hydrogen ions will be implanted at an energy of between 10 keV and 250 keV, and at a dose of between $5^E16/cm^2$ and $1^E17/cm^2$, to delimit a working layer 20 with a thickness on the order of 100 nm to 1500 nm. It should be noted that a protective layer can be deposited onto the front face 21*a* of the donor substrate 21, prior to the ion implantation step. This protective layer may be composed of a material such as silicon oxide or silicon nitride, for example. It is removed prior to the next phase.

Optionally, an intermediate layer 4 can be formed on the front face 21*a* of the donor substrate 21, before or after the second phase f2) of introduction of the light species (FIGS. 3B, 3C, 3D, and 3E). This intermediate layer 4 may be made of a semiconductor material, for example, silicon or silicon carbide, or of a metallic material such as tungsten, titanium, etc. The thickness of the intermediate layer 4 is advantageously limited, typically to between a few nanometers and a few tens of nanometers.

When the intermediate layer 4 is formed before phase f2), the implantation energy (and potentially the dose) of the light species will be adjusted for the crossing of this additional layer. When the intermediate layer 4 is formed after phase f2), care will be taken to form this layer by applying a thermal budget lower than the bubbling thermal budget, the bubbling thermal budget corresponding to the appearance of blisters on the surface of the donor substrate 21 due to excessive growth and pressurization of the microcavities in the buried fragile plane 22.

Figure 2C:
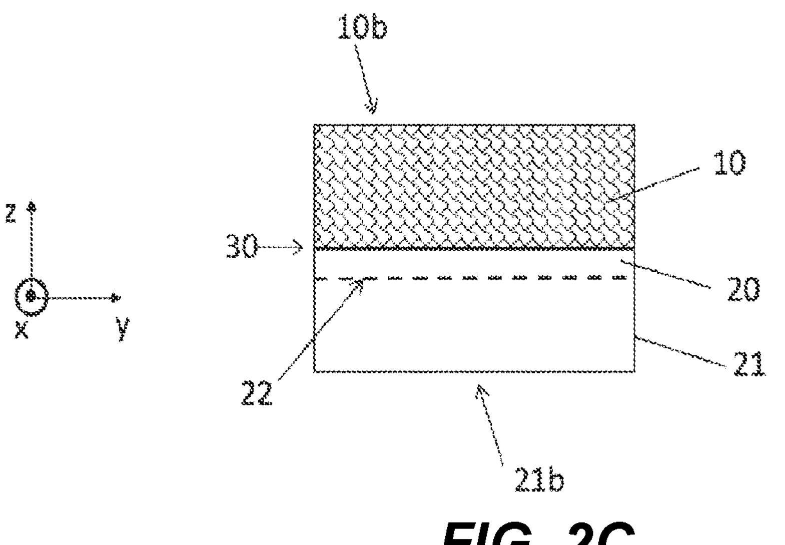

The transfer step f) then comprises a third phase f3) of assembling the donor substrate 21, on its front face side 21*a*, with the support substrate 10, on its first face side 10*a* or its second face side 10*b*, by molecular adhesive bonding, along a bonding interface 30 (FIG. 2C).

Optionally, an intermediate layer 4' may also be deposited on the face to be assembled of the support substrate 10, prior to the assembly phase f3) (FIGS. 3D, 3E); it may be chosen to be of the same nature as or of a different nature from the intermediate layer 4 mentioned for the donor substrate 21. An intermediate layer 4, 4' may optionally be deposited only on one or other of the two substrates 21, 10 to be assembled.

The purpose of the intermediate layer(s) is essentially to promote the bonding energy (notably in the temperature range below 1100° C.), due to the formation of covalent bonds at lower temperatures than in the case of two directly assembled SiC surfaces; another advantage of this (these) intermediate layer(s) may be to improve the vertical electrical conduction of the bonding interface 30.

Figures 2D, 3A:
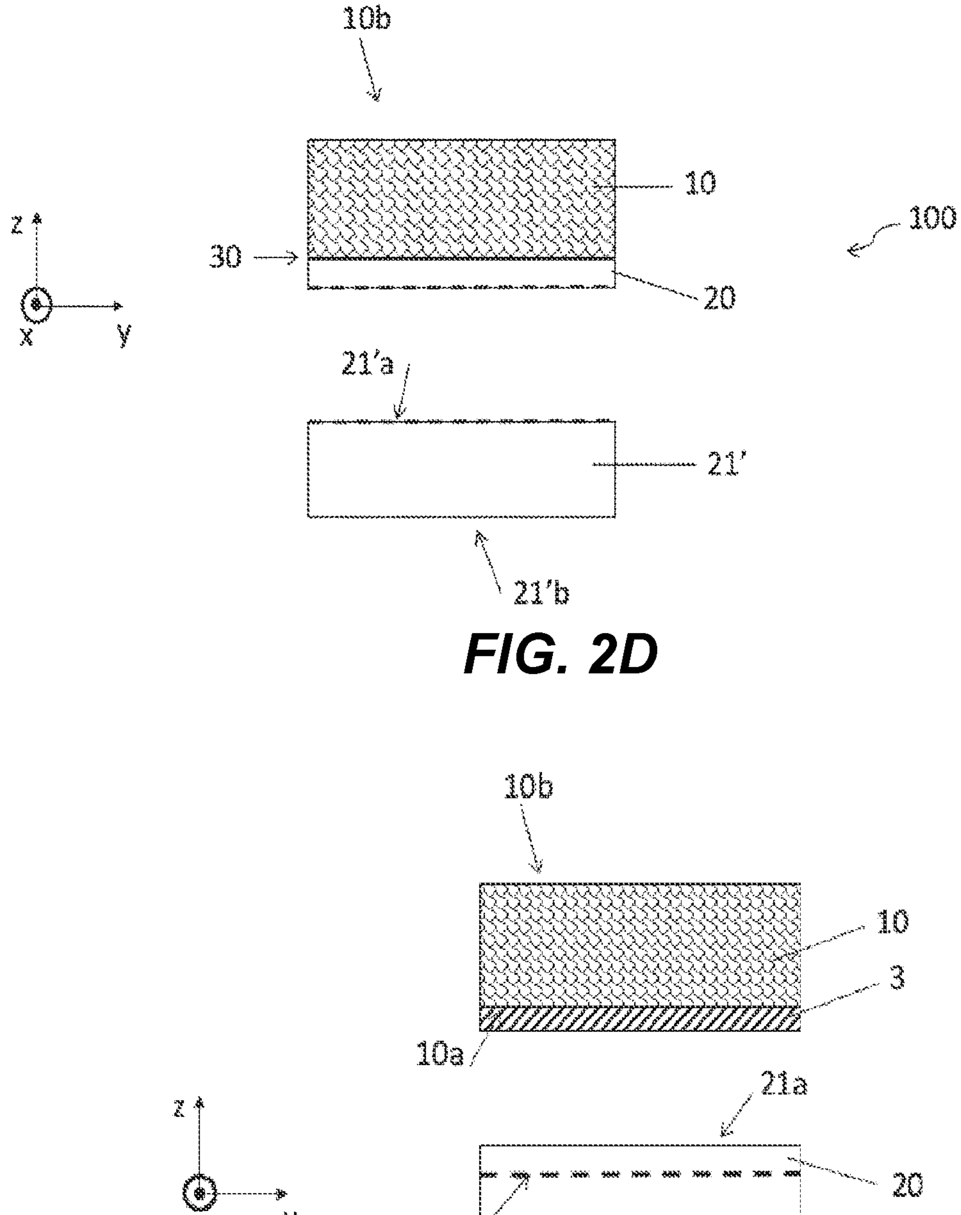
FIGS. 3A to 3E show variants of steps of a manufacturing process in accordance with the disclosure.
Figures 3B, 3C:
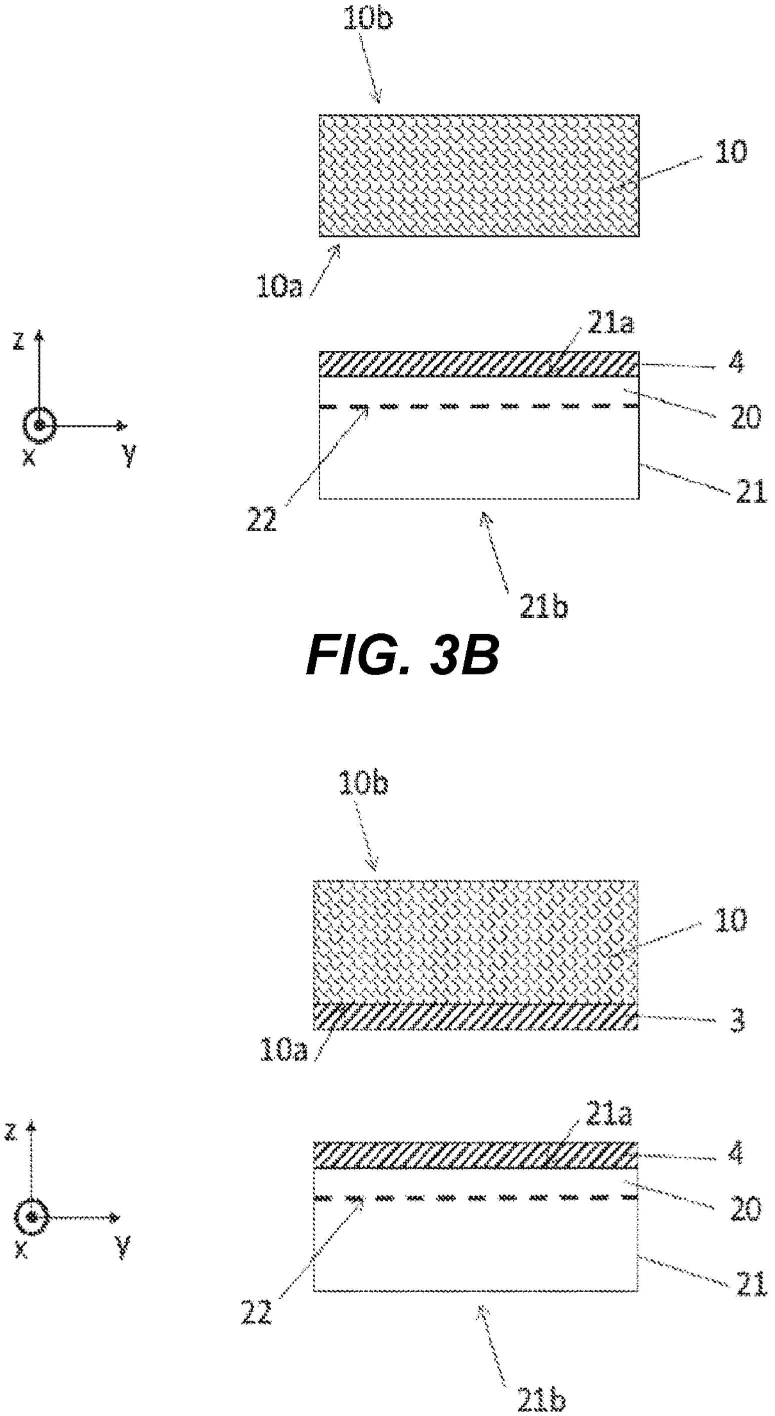
Figure 3D:
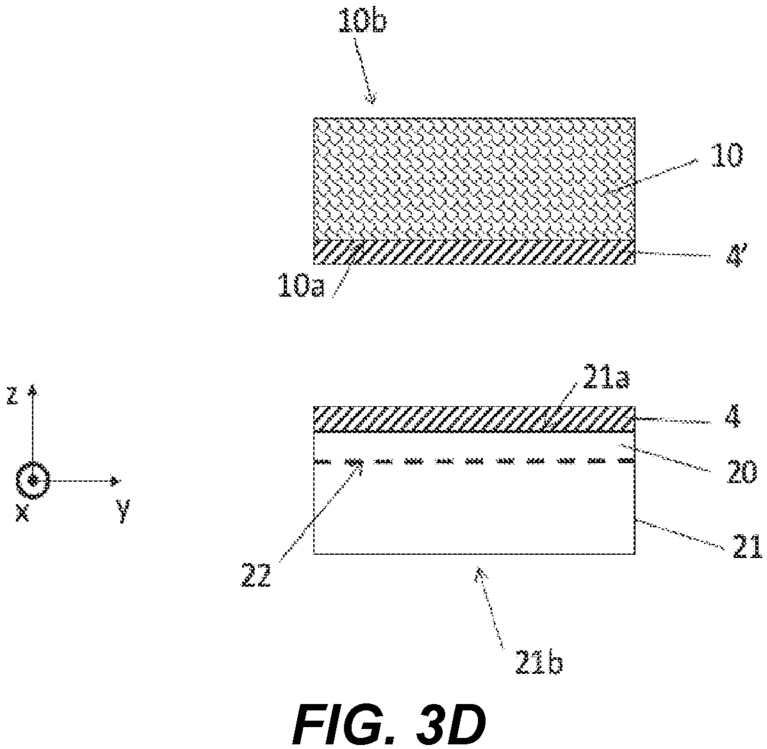

According to a conceivable variant, the intermediate layer may be formed by the stiffening carbon film 3, retained on the first face 10*a* of the support substrate 10 (FIGS. 3A, 3C). In this case, step e) of the manufacturing process according to the disclosure is not performed and the face of the support substrate 10 to be assembled is its first face 10*a* equipped with the stiffening carbon film 3. To promote vertical electrical conduction through the stiffening carbon film 3, in the final composite structure 100, a carbon film with a diamond-type crystallographic structure will be favored.

Figure 3E:
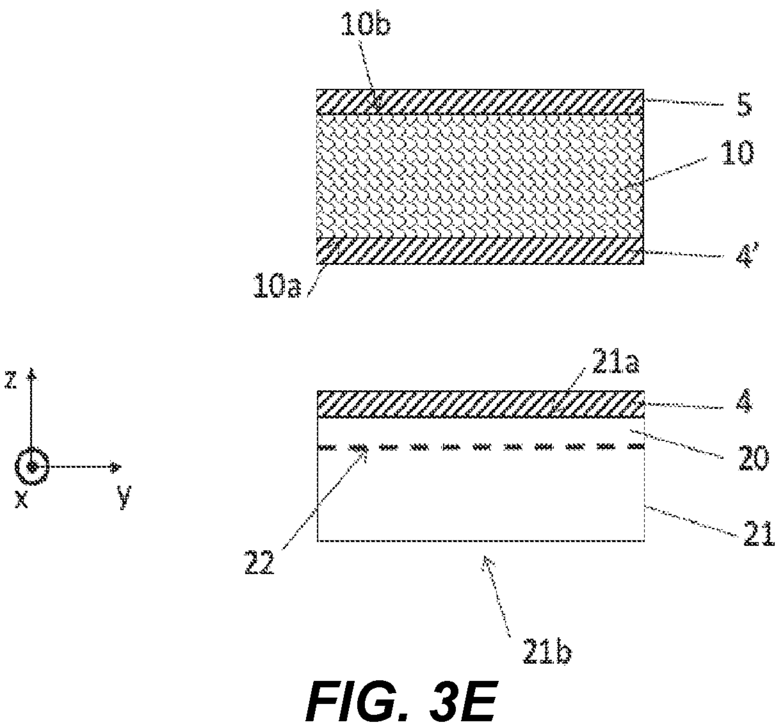

Optionally, an additional carbon film 5 is placed on the face of the support substrate 10 opposite the face to be assembled, still prior to the assembly phase f3) (FIG. 3E). Its characteristics may, for example, be chosen from those proposed for the stiffening carbon film 3 previously in the present description.

Even if the presence of this additional film 5 has been illustrated in FIG. 3E in combination with intermediate layers 4,4' on the faces to be assembled of the donor substrate 21 and of the support substrate 10, respectively, this additional carbon film 5 may be implemented in any of the possible configurations mentioned, notably those illustrated in FIGS. 3A to 3C.

The additional carbon film 5 may be removed at a later time, preferably after the composite structure 100 has undergone any heat treatments at temperatures above 1400° C. required for its manufacture or for that of components on and/or in the composite structure 100.

Returning to the description of the assembly phase f3), and as is well known per se, direct molecular adhesive bonding does not require an adhesive material, since bonds are established at the atomic level between the assembled surfaces. Several types of molecular adhesive bonding exist, which differ notably in their temperature, pressure or atmosphere conditions or treatments prior to bringing the surfaces into contact. Mention may be made of bonding at room temperature with or without prior plasma activation of the surfaces to be assembled, atomic diffusion bonding (ADB), surface activated bonding (SAB), etc.

The assembly phase f3) may comprise, prior to bringing the faces 21*a*, 10*a* to be assembled into contact, conventional sequences of chemical cleaning (for example, RCA cleaning) and of surface activation (for example, by means of oxygen or nitrogen plasma) or other surface preparations (such as scrubbing), which are likely to promote the quality of the bonding interface 30 (low defect density, high adhesion energy).

Finally, a fourth phase f4) involves separation along the buried fragile plane 22, leading to the transfer of the working layer 20 onto the support substrate (FIG. 2D).

The separation along the buried fragile plane 22 is usually performed by applying a heat treatment at a temperature of between 800° C. and 1200° C. Such a heat treatment causes cavities and microcracks to develop in the buried fragile plane 22 and causes them to be pressurized by the light species present in gaseous form, until a fracture propagates along the fragile plane 22. Alternatively, or jointly, a mechanical stress can be applied to the bonded assembly and, in particular, to the buried fragile plane 22, so as to propagate or assist in mechanically propagating the fracture leading to the separation. On conclusion of this separation, the composite structure 100 comprising the support substrate 10 and the transferred working layer 20 made of single-crystal SiC, on the one hand, and the remainder 21' of the donor substrate, on the other hand, are obtained. The level and the type of doping of the working layer 20 are defined by the choice of the properties of the donor substrate 21 or can be adjusted subsequently via the known techniques for doping semiconductor layers.

The free surface 20*a* of the working layer 20 is usually rough after separation: for example, it has a roughness of between 5 nm and 100 nm RMS (AFM, 20 μm×20 μm scan). Cleaning and/or smoothing phases can be applied so as to restore a good surface finish (typically, a roughness of less than a few angstroms RMS on a 20 μm×20 μm AFM scan). In particular, these phases may include a chemical-mechanical polishing (CMP) smoothing treatment of the free surface of the working layer 20. Removal of between 50 nm and 300 nm makes it possible to effectively restore the surface finish of the working layer 20. The phases may also comprise at least a heat treatment at a temperature of between 1300° C. and 1800° C. Such a heat treatment is applied to clear the residual light species from the working layer 20 and to promote the rearrangement of the crystal lattice of the working layer 20. It also makes it possible to reinforce the bonding interface 30.

The heat treatment may also comprise or correspond to an epitaxy of silicon carbide on the thin working layer 20.

Finally, it should be noted that the transfer step f) may comprise a step of reconditioning the remainder 21' of the donor substrate for reuse as donor substrate 21 for a new composite structure 100. Mechanical and/or chemical treatments, similar to those applied to the composite structure 100, may be applied to the front face 21'*a* of the remaining substrate 21'.

The composite structure 100 obtained is extremely robust with respect to the very high temperature heat treatments that may be applied to improve the quality of the working layer 20 or to manufacture components on and/or in the working layer 20.

The composite structure 100 according to the disclosure is particularly suitable for the production of one (or more) high-voltage microelectronic component(s), for instance, Schottky diodes, MOSFET transistors, etc. More generally, it is suitable for power microelectronic applications, allowing excellent vertical electrical conduction, good thermal conductivity and affording a high-quality c-SiC working layer.

Needless to say, the disclosure is not limited to the described embodiments and examples, and implementation variants may be applied thereto without departing from the scope of the invention as defined by the claims.

The invention claimed is:

1. A method of manufacturing a polycrystalline silicon carbide support substrate, comprising the following steps:

a) growing an initial polycrystalline silicon carbide support substrate on a seed of graphite or silicon carbide; on conclusion of step a), the initial substrate having a free front face and a rear face in contact with the seed;

b) forming a stiffening carbon film on the front face of the initial substrate, the initial substrate having, in a plane of its front face and just before formation of the stiffening carbon film, a first average silicon carbide grain, size;

c) removing the seed, so as to free the rear face of the initial substrate, the initial substrate having, in a plane of its rear face and just after removal of the seed, a second average silicon carbide grain size, smaller than the first average silicon carbide grain size; and d) thinning the rear face of the initial substrate to a thickness for which the initial substrate has, in the plane of its thinned rear face, a third average grain size equal to the first average silicon carbide grain size to within ±30%, the thinned initial substrate forming the polycrystalline silicon carbide support substrate.

2. The method of claim 1, further comprising forming the stiffening carbon film has to have a thickness of between 100 nm and several millimeters.

3. The method of claim 2, further comprising forming the stiffening carbon film to have a thickness of between 100 nm and 10 μm.

4. The method of claim 1, further comprising forming the stiffening carbon film so as to have a diamond-like or glassy carbon-like crystallographic structure.

5. The method of claim 1, wherein step b) is performed by spreading a polymer resin having preformed carbon-carbon bonds in three dimensions as a viscous layer on the front face of the initial substrate and annealing at a temperature of between 500° C. and 2000° C. to form the stiffening carbon film.

6. The method of claim 5, wherein the polymer resin comprises at least one material selected from among coal tar, phenol formaldehyde, polyfurfuryl alcohol, polyvinyl alcohol, polyacrylonitrile, polyvinylidene chloride, or polystyrene.

7. The method of claim 1, wherein step b) is performed by plasma deposition, ion bombardment deposition or evaporation deposition.

8. The method of claim 1, further comprising a step a'), between step a) and step b), of grinding the front face and/or a periphery of the initial substrate, to reduce a surface roughness of the front face and/or to reduce a thickness variation of the initial substrate, and/or to regularize the periphery of the initial substrate.

9. The method of claim 8, wherein step a') comprises mechanical or chemical-mechanical thinning.

10. The method of claim 1, further comprising:

a step e), after step d), of removing the stiffening carbon film, and/or a step, after step d) or after step e), of heat treatment at a temperature greater than or equal to 1500° C.

11. The method of claim 1, further comprising a step f) of transferring a thin layer of single-crystal silicon carbide onto a first face or a second face of the silicon carbide support substrate, directly or via an intermediate layer, to form a composite structure.

12. The method of claim 11, wherein the step f) comprises transferring the thin layer of single-crystal silicon carbide onto the first face of the silicon carbide support substrate via the intermediate layer, and wherein the intermediate layer comprises the stiffening carbon film.

13. The method of claim 11, wherein the transferring of the thin layer of single-crystal silicon carbide onto a first face is performed on one of the first or second faces of the silicon carbide support substrate, the method further comprising providing an additional carbon film on the other of the first or second faces of the silicon carbide support substrate prior to the transferring of the thin layer.

14. The method of claim 13, further comprising removing the additional carbon film is.

15. The method of claim 14, wherein the additional carbon film is removed after the composite structure has undergone heat treatments at temperatures above 1400° C. required for manufacture of the composite structure or required for manufacture of components on and/or in the composite structure.

16. The method of claim 2, further comprising forming the stiffening carbon film to have a thickness of between 100 nm and 10 millimeters.

17. The method of claim 3, further comprising forming the stiffening carbon film so as to have a diamond-like or glassy carbon-like crystallographic structure.

18. The method of claim 17, wherein step b) is performed by spreading a polymer resin having preformed carbon-carbon bonds in three dimensions as a viscous layer on the front face of the initial substrate and annealing at a temperature of between 500° C. and 2000° C. to form the stiffening carbon film.

19. The method of claim 18, further comprising a step a'), between step a) and step b), of grinding the front face and/or a periphery of the initial substrate, to reduce a surface roughness of the front face and/or to reduce a thickness variation of the initial substrate, and/or to regularize the periphery of the initial substrate.

20. The method of claim 19, wherein step a') comprises mechanical or chemical-mechanical thinning.

* * * * *